(12) United States Patent
Hara et al.

(10) Patent No.: US 7,675,803 B2
(45) Date of Patent: Mar. 9, 2010

(54) MEMORY CIRCUIT SYSTEM HAVING SEMICONDUCTOR DEVICES AND A MEMORY

(75) Inventors: Takahiko Hara, Yokohama (JP); Midori Morooka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 11/738,652

(22) Filed: Apr. 23, 2007

(65) Prior Publication Data
US 2007/0246807 A1    Oct. 25, 2007

(30) Foreign Application Priority Data
Apr. 24, 2006   (JP)  ............................. 2006-119415

(51) Int. Cl.
*G11C 5/14*   (2006.01)
(52) U.S. Cl. .................... 365/226; 365/189.09; 711/170
(58) Field of Classification Search ................. 365/226, 365/189.09; 711/170
See application file for complete search history.

(56) References Cited

U.S. PATENT DOCUMENTS

| 4,734,909 A | * | 3/1988 | Bennett et al. ............... 370/462 |
| 6,496,911 B1 | | 12/2002 | Dixon et al. |
| 6,667,928 B2 | * | 12/2003 | Honma et al. ................ 365/226 |
| 2004/0111596 A1 | * | 6/2004 | Rawson, III ................... 713/1 |

FOREIGN PATENT DOCUMENTS

| JP | 7-105151 | 11/1995 |
| JP | 2004-46502 | 2/2004 |

* cited by examiner

*Primary Examiner*—Hoai V Ho
*Assistant Examiner*—Fernando N Hidalgo
(74) *Attorney, Agent, or Firm*—Oblon, Spivak, McClelland, Maier & Neustadt, L.L.P.

(57) ABSTRACT

A semiconductor device includes a plurality of semiconductor chips and a memory device. The semiconductor chips are provided in a package. Each of the semiconductor chips includes a memory cell array having memory cells which stores data, an output buffer which outputs data read from the memory cell array to an exterior of the semiconductor chip and a control circuit which controls driving power of the output buffer. The memory device stores the number of semiconductor chips provided in the package. The control circuit controls the driving power according to the number of semiconductor chips stored in the memory device.

18 Claims, 15 Drawing Sheets

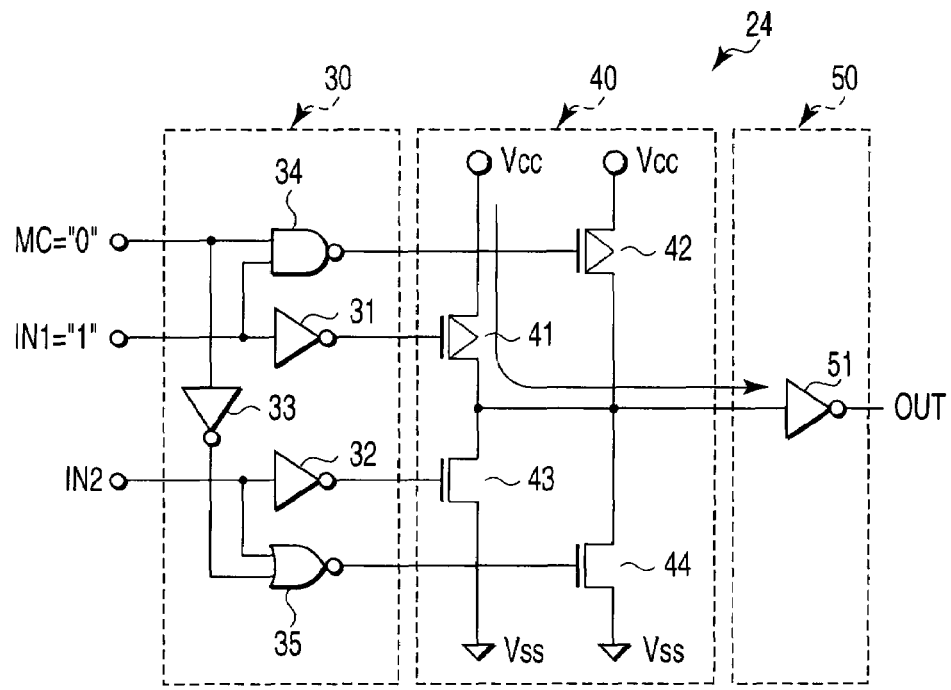
F I G. 7
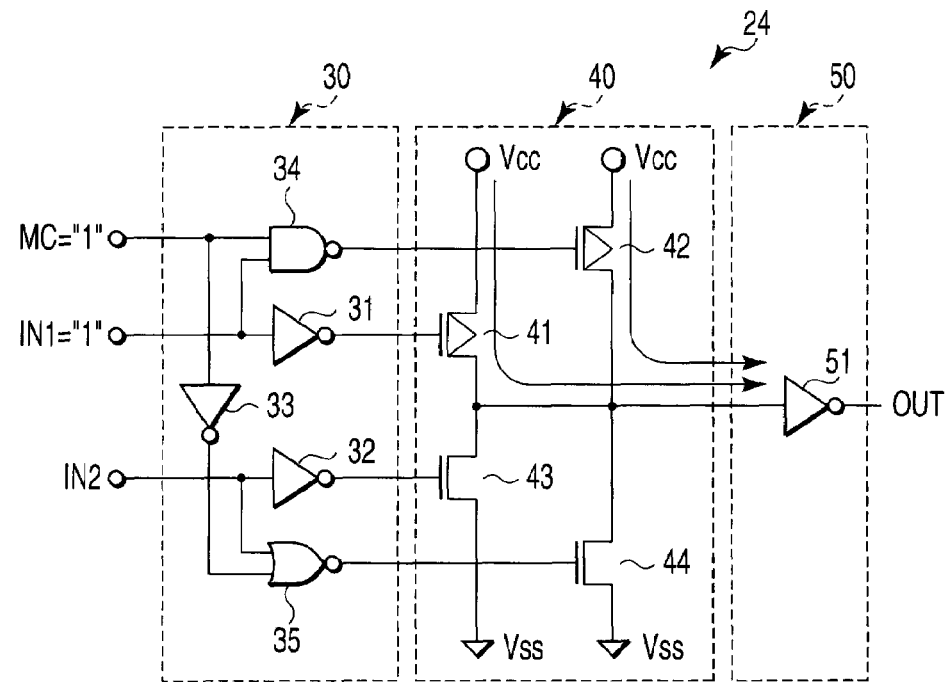
F I G. 8

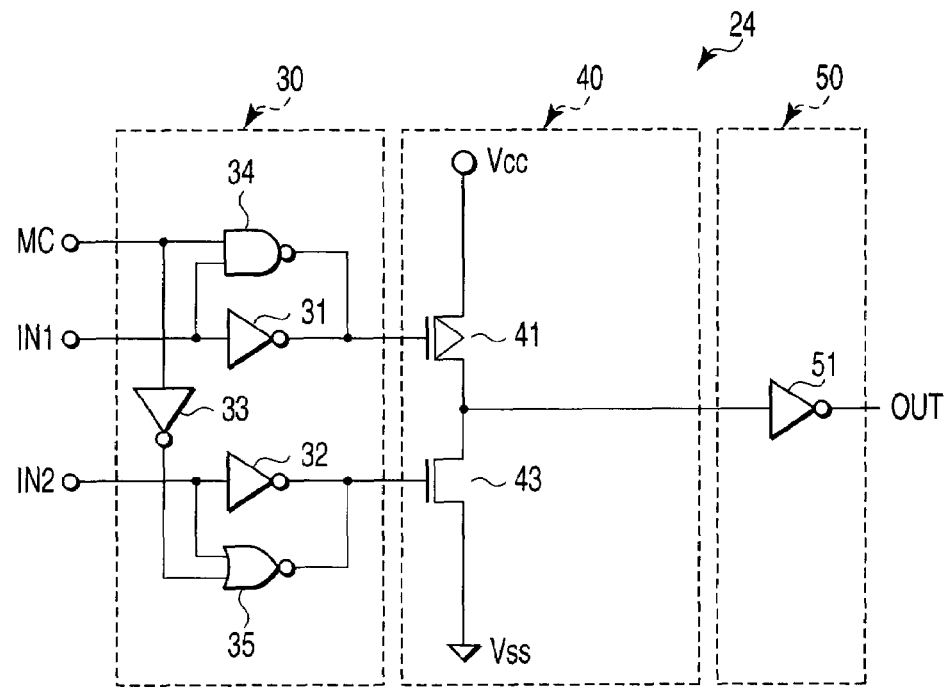
F I G. 1 7
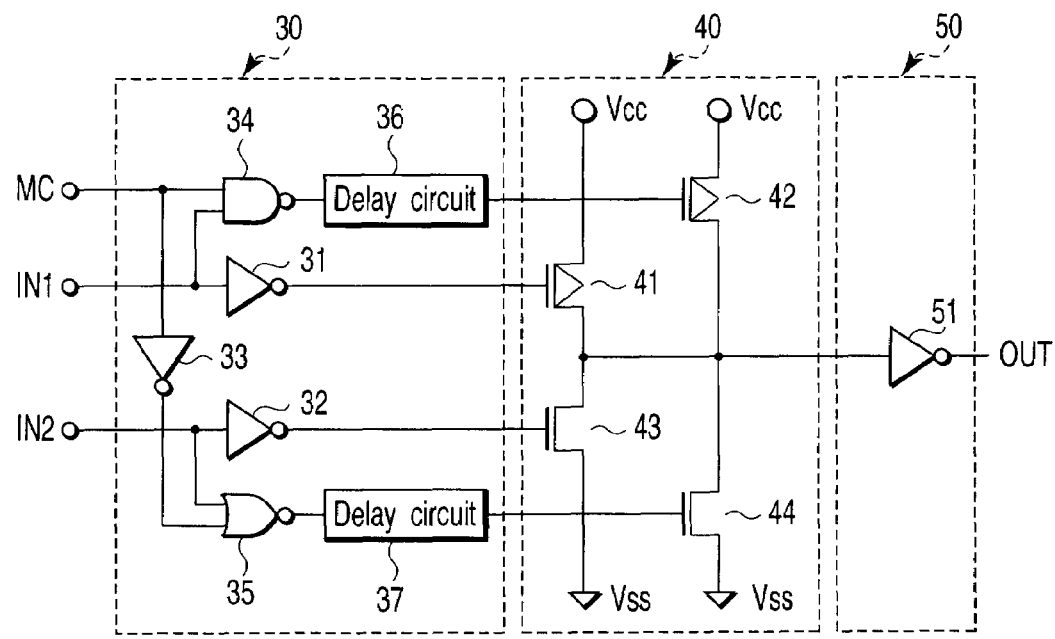
F I G. 1 8

US 7,675,803 B2

MEMORY CIRCUIT SYSTEM HAVING SEMICONDUCTOR DEVICES AND A MEMORY

CROSS-REFERENCE TO RELATED APPLICATIONS

This application is based upon and claims the benefit of priority from prior Japanese Patent Application No. 2006-119415, filed Apr. 24, 2006, the entire contents of which are incorporated herein by reference.

BACKGROUND OF THE INVENTION

1. Field of the Invention

This invention relates to a semiconductor device and memory circuit system. For example, this invention relates to a semiconductor memory including MOS transistors having charge accumulation layers and control gates.

2. Description of the Related Art

In recent years, the demand for nonvolatile semiconductor memories with large capacity increases with the rapid popularization of digital cameras and mobile audio players. Further, NAND flash memories are widely used as the nonvolatile semiconductor memories.

With the above background, it is required to enhance the driving power of an output buffer of a semiconductor chip having nonvolatile semiconductor memories mounted thereon in order to transmit information of large capacity at high speed. The configuration of the output buffer is disclosed in Jpn. Pat. Appn. KOKOKU Publication No. H7-105151, for example.

When the driving power of the output buffer is low, the data transmission speed is lowered. However, if the driving power is made higher than necessary, there occurs a problem that the power consumption is increased and the operation becomes unstable due to overshoot and ringing of signal waveforms.

BRIEF SUMMARY OF THE INVENTION

A semiconductor device according to an aspect of the present invention includes:

a plurality of semiconductor chips provided in a package, each of the semiconductor chips including a memory cell array having memory cells which stores data, an output buffer which outputs data read from the memory cell array to an exterior of the semiconductor chip and a control circuit which controls driving power of the output buffer, and a memory device which stores the number of semiconductor chips provided in the package, the control circuit controlling the driving power according to the number of semiconductor chips stored in the memory device.

A memory circuit system according to an aspect of the present invention includes:

a plurality of semiconductor devices each of which have a first semiconductor chip in a package, the first semiconductor chip of at least one of the semiconductor device including a memory cell array having memory cells which store data, an output buffer which outputs data read from the memory cell array to an exterior, and a control circuit which controls driving power of the output buffer;

a data bus which connects the semiconductor devices;

a system control device which detects the number of semiconductor devices connected to the data bus, and a memory device which stores the number of semiconductor devices detected by the system control device, the control circuit controlling the driving power according to the number of semiconductor devices stored in the memory device.

BRIEF DESCRIPTION OF THE SEVERAL VIEWS OF THE DRAWING

FIG. 7 is a circuit diagram of a data output buffer in the semiconductor chip provided in the semiconductor device according to the first embodiment of this invention in a case wherein the number of semiconductor chips is small;

FIG. 8 is a circuit diagram of a data output buffer in the semiconductor chip provided in the semiconductor device according to the first embodiment of this invention in a case wherein the number of semiconductor chips is large;

FIG. 17 is a circuit diagram of a data output buffer provided in a semiconductor memory according to a second modification of the first to third embodiments of this invention;

FIG. 18 is a circuit diagram of a data output buffer provided in a semiconductor memory according to a third modification of the first to third embodiments of this invention;

DETAILED DESCRIPTION OF THE INVENTION

Figure 1:
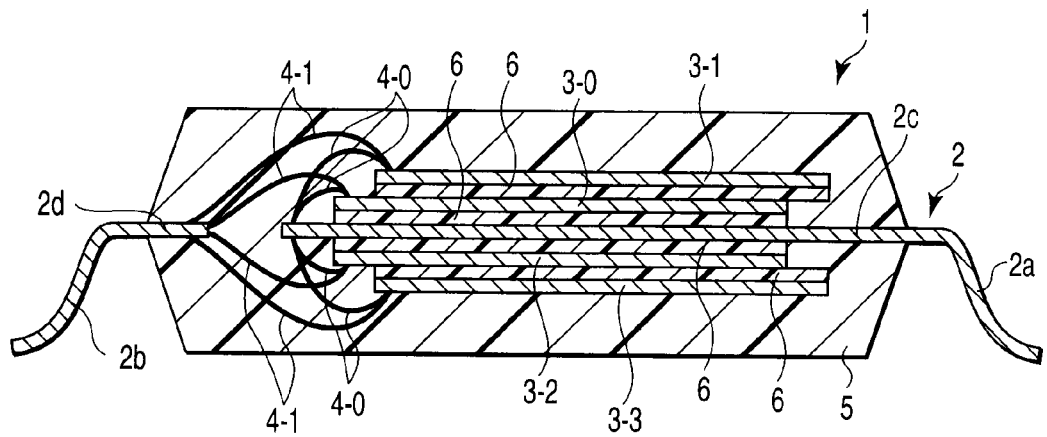
FIG. 1 is a cross-sectional view of a semiconductor device according to a first embodiment of this invention.

A semiconductor device according to a first embodiment of this invention is explained with reference to FIG. 1. FIG. 1 is a cross-sectional view of a semiconductor device (semiconductor package device) according to the present embodiment. An example in which four semiconductor chips are packaged in one semiconductor device is shown.

As shown in FIG. 1, a semiconductor device 1 includes a lead frame 2, semiconductor chips 3-0 to 3-3, bonding wires 4-0, 4-1 and sealing resin 5. The lead frame 2 has a plurality of external leads 2a, 2b and internal leads 2c, 2d respectively formed to extend inwardly (in directions opposite to each other) from the external leads 2a, 2b. The internal leads 2c, 2d are formed to have different lengths. The internal lead 2c which is a longer internal lead, for example, is used as a die lead portion (chip mounting portion) on which the semiconductor chips 3-0 to 3-3 are mounted.

The semiconductor chip 3-0 is adhered to one of the surfaces of the internal lead 2c by use of a spacer 6 with the semiconductor element forming surface (bonding pad forming surface) thereof facing up. Further, on the semiconductor chip 3-0, the semiconductor chip 3-1 is adhered to the semiconductor chip 3-0 by use of a spacer 6 with the semiconductor element forming surface thereof facing up. The two semiconductor chips 3-0, 3-1 are laminated with bonding pads closely set and deviated in position from each other in plane. The semiconductor chip 3-2 is adhered to the other surface of the internal lead 2c by use of a spacer 6 with the semiconductor element forming surface (bonding pad forming surface) thereof facing up. Further, on the semiconductor chip 3-2, the semiconductor chip 3-3 is adhered to the semiconductor chip 3-2 by use of a spacer 6 with the semiconductor element forming surface thereof facing up. The two semiconductor chips 3-2, 3-3 are laminated with bonding pads closely set and deviated in position from each other in plane. In FIG. 1, the bonding pads are omitted and are not shown.

The bonding wires 4-0 respectively connect the bonding pads of the semiconductor chips 3-0 to 3-3 to the internal leads 2c. Further, the bonding wires 4-1 respectively connect the bonding pads of the semiconductor chips 3-0 to 3-3 to the internal leads 2d. The semiconductor chips 3-0 to 3-3 and internal leads 2c, 2d are enclosed and sealed in the resin 5 to form the semiconductor device 1. Different chip addresses are given to the four semiconductor chips by optional bonding.

Figure 2:
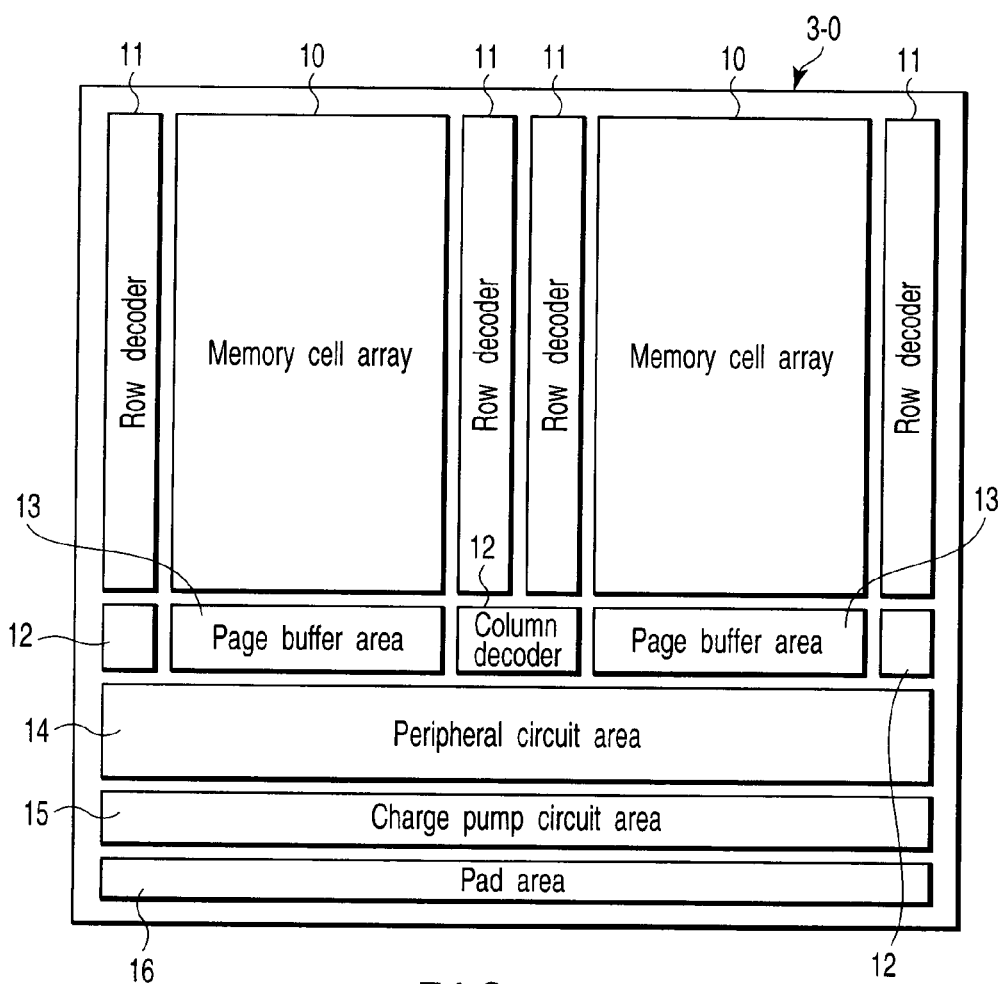
FIG. 2 is a block diagram of a semiconductor chip provided in the semiconductor device according to the first embodiment of this invention.

FIG. 2 is a block diagram showing the schematic internal configuration of the semiconductor chip 3-0 shown in FIG. 1. The semiconductor chips 3-1 to 3-3 also have the same configuration. As shown in FIG. 2, the semiconductor chip 3-0 includes memory cell arrays 10, row decoders 11, column decoders 12, page buffer areas 13, peripheral circuit area 14, charge pump circuit area 15 and pad area 16. In an example of FIG. 2, the semiconductor chip 3-0 includes the two memory cell arrays 10 and the two row decoders 11 are allocated to each of the memory cell arrays 10. The number of memory cell arrays 10 is not limited to two and can be set to four or eight or one, for example. The row decoders 11, column decoders 12 and page buffer areas 13 are arranged adjacent to the memory cell arrays 10. The page buffer area 13 includes a bit line control circuit. The peripheral circuit area 14, charge pump circuit area 15 and pad area 16 are collectively arranged on the end portion of the semiconductor chip 3-0. The peripheral circuit area 14 includes a substrate potential control circuit, word line potential control circuit, address buffer, data output buffer, data input buffer, control circuit and register. Further, the charge pump circuit area 15 includes a voltage detector circuit and boosted potential generation circuit. The pad area 16 is an area which is formed along one side of the semiconductor chip 3-0 and in which bonding pads connected to the bonding wires 4-0, 4-1 are formed.

Figure 3:
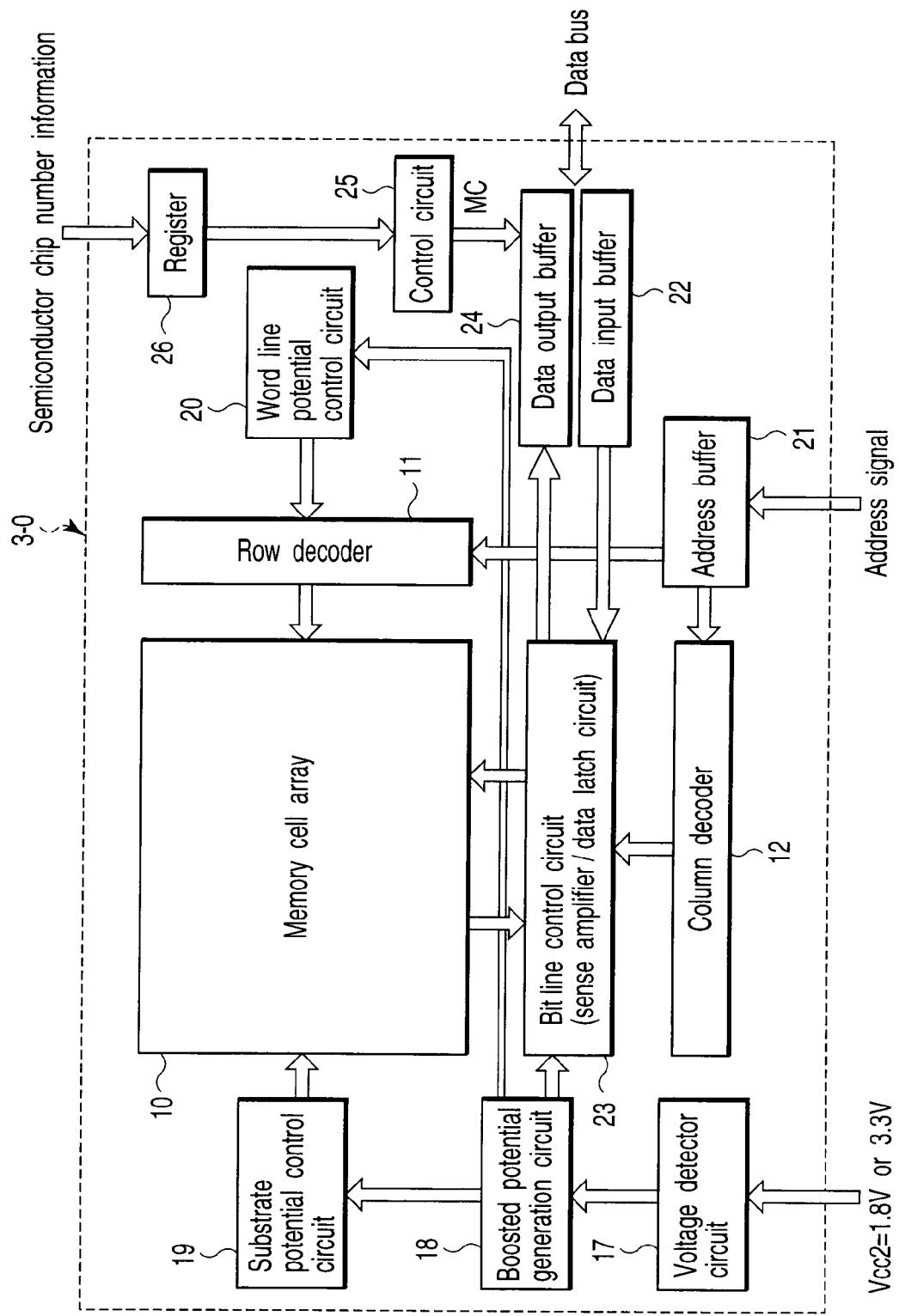
FIG. 3 is a block diagram of a semiconductor chip provided in the semiconductor device according to the first embodiment of this invention.

The detail configuration of the semiconductor chip 3-0 is explained with reference to FIG. 3. FIG. 3 is a block diagram of the semiconductor chip 3-0. The semiconductor chips 3-1 to 3-3 have the same configuration. In FIG. 3, the pad area 16 is omitted and is not shown.

As shown in FIG. 3, the semiconductor chip 3-0 includes a memory cell array 10, row decoder 11, column decoder 12, voltage detector circuit 17, boosted potential generation circuit 18, substrate potential control circuit 19, word line potential control circuit 20, address buffer 21, data input buffer 22, bit line control circuit 23, data output buffer 24, control circuit 25 and register 26.

Figure 4:
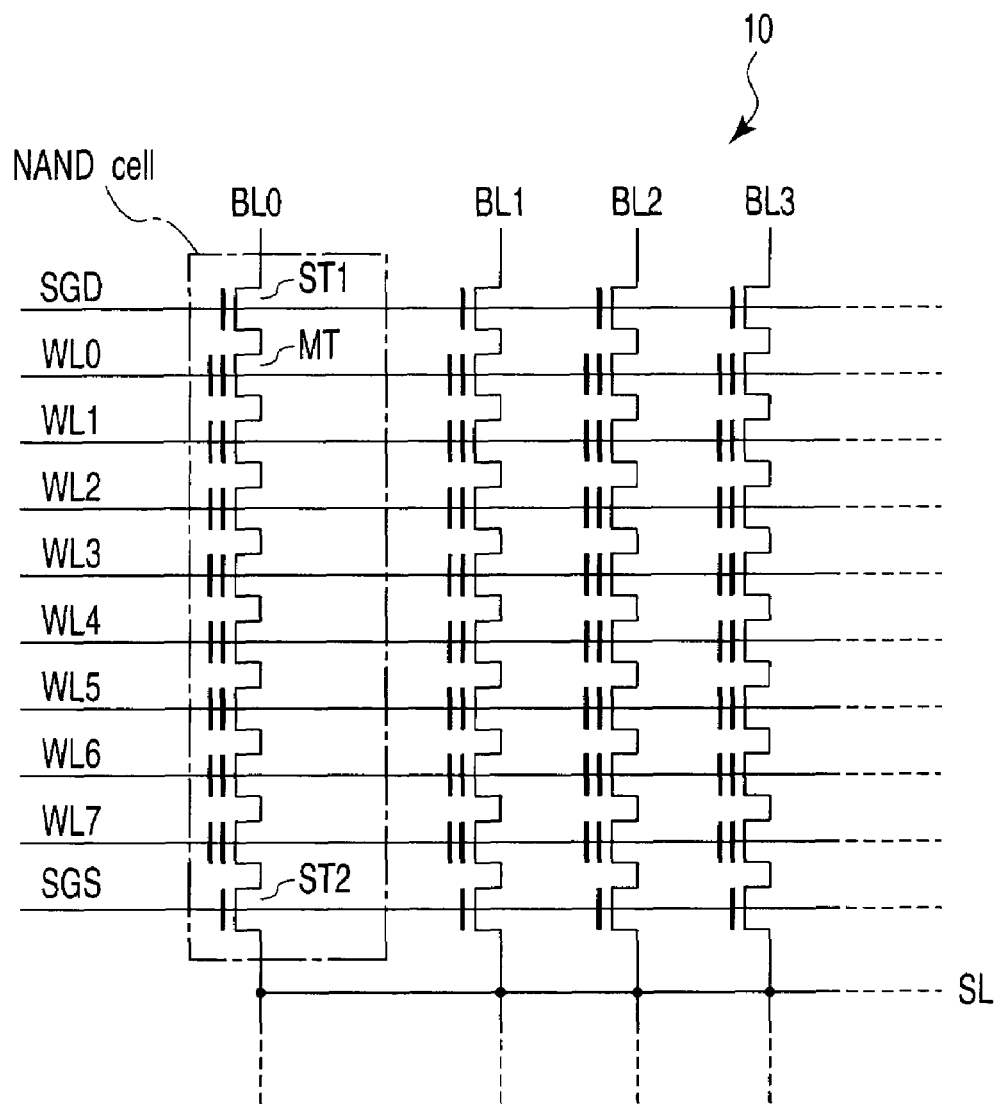
FIG. 4 is a circuit diagram of a memory cell array in the semiconductor chip provided in the semiconductor device according to the first embodiment of this invention.

The memory cell array 10 has NAND flash memory cells to store data. FIG. 4 is a circuit diagram of the memory cell array 10. As shown in FIG. 4, the memory cell array has a plurality of NAND cells arranged in a matrix form. Each of the NAND cells includes eight memory cell transistors MT and selection transistors ST1, ST2. The memory cell transistor MT has a stacked gate structure having a charge accumulation layer formed on the semiconductor substrate with a gate-gate insulating film interposed therebetween and a control gate formed on the charge accumulation layer with a gate-gate insulating film interposed therebetween. A case wherein a floating gate is used as the charge accumulation layer is explained below. In this case, the number of memory cell transistors MT is not limited to eight and can be set to 16 or 32 and the number is not limited to a specified number. The adjacent memory cell transistors MT commonly have a source or drain. The current paths of the memory cell transistors are serially connected between the selection transistors ST1 and ST2. The drain region of the series-connected memory cell transistors MT on one end side is connected to the source region of the selection transistor ST1 and the source region thereof on the other end side is connected to the drain region of the selection transistor ST2.

The control gates of the memory cell transistors MT which lie on the same row are commonly connected to a corresponding one of word lines WL0 to WL7 and the gates of the selection transistors ST1, ST2 which lie on the same row are commonly connected to respective select gate lines SGD, SGS. The word lines WL0 to WL7 and select gate lines SGS, SGD are connected to the row decoder 11. Further, the drains of the selection transistors ST1 which lie on the same column are commonly connected to a corresponding one of bit lines BL0 to BLn (n is a natural number). The sources of the selection transistors ST2 are commonly connected to a source line SL and connected to a source line driver (not shown). Both of the selection transistors ST1 and ST2 are not necessarily required. If it is possible to selectively activate one of the NAND cells, only one of the selection transistors may be provided.

The explanation is further continuously made with reference to FIG. 3. The voltage detector circuit 17 detects power supply voltage applied to the semiconductor chip 3-0 from the exterior. For example, one of the voltages of 1.8 V and 3.3 V is applied to the semiconductor chip 3-0 as power supply voltage Vcc2. The voltage detector circuit 17 detects that the power supply voltage Vcc2 is set at 1.8 V or 3.3 V and outputs information of the detection result to the boosted potential generation circuit 18.

The boosted potential generation circuit 18 generates voltage required for the operation of the NAND flash memory based on the power supply voltage Vcc2 and information supplied from the voltage detector circuit 17.

The substrate potential control circuit 19 controls the voltage of the semiconductor substrate on which the memory cell array 10 is formed by use of the voltage generated by the boosted potential generation circuit 18.

The word line potential control circuit 20 controls voltages applied to the word lines based on the voltage generated by the boosted potential generation circuit 18.

The address buffer 21 holds an address signal supplied from the exterior of the semiconductor chip 3-0. Then, it outputs the address signal to the row decoder 11 and column decoder 12.

The row decoder 11 selects one of the word lines specified by the address signal supplied from the address buffer 21 and applies voltage supplied from the word line potential control circuit 20 to the selected word line.

The column decoder 12 selects one of the bit lines specified by the address signal.

The data input buffer 22 holds write data supplied from the exterior. Then, it supplies the write data to the bit line control circuit 23.

The bit line control circuit 23 includes a sense amplifier and data latch circuit. The sense amplifier amplifies read data read to the bit line selected by the column decoder 12 at the data read time. The data latch circuit supplies write data from the data input buffer 22 to the bit line selected by the column decoder 22 at the data write time.

The register 26 holds information indicating the number of semiconductor chips contained in the semiconductor device 1. In the case of the present embodiment, the semiconductor device 1 includes the four semiconductor chips 3-0 to 3-3, and therefore, the register holds information indicating "four chips". The information may be previously written at the manufacturing time of the semiconductor device 1 or written after manufacturing by use of exclusive input pins. Information held by the register 26 is supplied to the control circuit 25.

The control circuit 25 generates a control signal MC according to information in the register 26. Then, the control circuit 25 controls the voltage driving power of the data output buffer 24 according to the control signal MC. That is, the voltage driving power of the data output buffer 24 is made higher as the number of semiconductor chips contained in the semiconductor device 1 becomes larger and the voltage driving power is made lower as the number of semiconductor chips becomes smaller.

Figure 5:
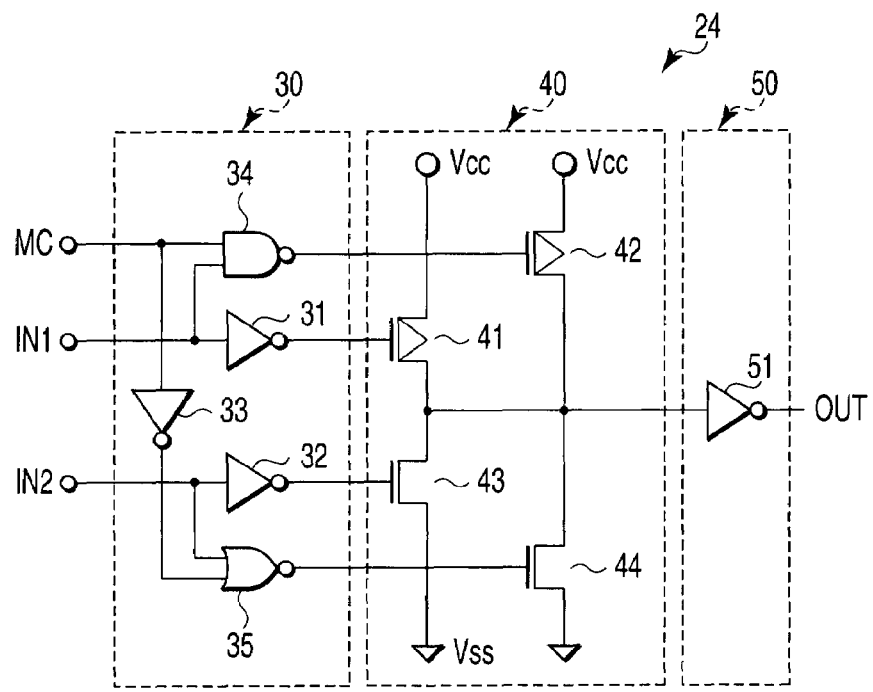
FIG. 5 is a circuit diagram of a data output buffer in the semiconductor chip provided in the semiconductor device according to the first embodiment of this invention.

The data output buffer 24 holds read data amplified by the bit line control circuit 23. Then, it outputs the data to the exterior of the semiconductor chip 3-0. The data output buffer 24 outputs read data to a data bus connecting the semiconductor device 1 to a host which requests read data. The configuration of the data output buffer 24 is explained with reference to FIG. 5. FIG. 5 is a circuit diagram of the data output buffer 24.

As shown in FIG. 5, the data output buffer 24 includes a drive circuit 30, output driver 40 and interface circuit 50. The drive circuit 30 includes inverters 31 to 33, NAND gate 34 and NOR gate 35 and is supplied with the control signal MC from the control circuit 25 and read data IN1, IN2 from the bit line control circuit 23. The inverters 31, 32 respectively invert the read data IN1, IN2. The inverter 33 inverts the control signal MC. The NAND gate 34 calculates the logical NAND of the control signal MC and read data IN1. The NOR gate 35 calculates the logical NOR of the output signal of the inverter 33 and read data IN2.

The output driver 40 has p-channel MOS transistors 41, 42 and n-channel MOS transistors 43, 44. The sources of the MOS transistors 41, 42 are connected to power supply voltage nodes Vcc and the gates thereof are respectively supplied with output signals of the inverter 31 and NAND gate 34. The sources of the MOS transistors 43, 44 are connected to ground potential nodes Vss and the gates thereof are respectively supplied with output signals of the inverter 32 and NOR gate 35. The drains of the MOS transistors 41 to 44 are commonly connected.

The interface circuit 50 includes an inverter 51. The inverter 51 inverts a signal on the common connection node of the drains of the MOS transistors 41 to 44. An output signal of the inverter 51 is supplied to the data bus via an output pin (internal lead and external lead of the lead frame 2).

Figure 6:
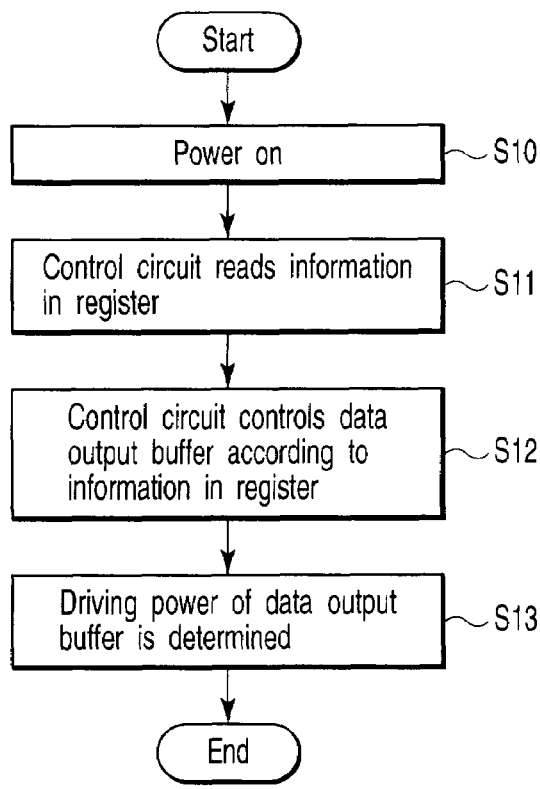
FIG. 6 is a flowchart for illustrating a process of the semiconductor device at the time of supply of power according to the first embodiment of this invention.

The operation of the semiconductor chip 3-0 with the above configuration performed immediately after supply of power is explained with much attention paid to the control circuit 25 and data output buffer 24. FIG. 6 is a flowchart for illustrating the operations of the control circuit 25 and data output buffer 24 performed immediately after supply of power. The operations of the semiconductor chips 3-1 to 3-3 are the same as that of the semiconductor chip 3-0 and the explanation thereof is omitted.

First, the power supply switch of the semiconductor device 1 is turned on (step S10). Then, the control circuit 25 of the semiconductor chip 3-0 reads information indicating the number of semiconductor chips held in the register 26 on the semiconductor chip 3-0 (step S11). The control circuit 25 generates a control signal MC according to the read information to control the voltage driving power of the data output buffer 24 (step S12). As a result, the voltage driving power of the data output buffer 24 is determined (step S13). The process of step S12 is performed according to the result of determination that the number of semiconductor chips contained in the semiconductor device 1 is large or small. More specifically, for example, the process is performed according to the following method. That is, the specified number of chips is previously held in the register 26. Then, in step S11, information indicating the specified number of chips is read from the register 26 together with the number of semiconductor chips and compared with the number of semiconductor chips. If the number of semiconductor chips is larger than the specified number, the voltage driving power of the data output buffer 24 is made higher, and if it is smaller than the specified number, the voltage driving power is made lower. The state of the data output buffer 24 controlled is explained with reference to FIGS. 7 and 8. FIGS. 7 and 8 are circuit diagrams of the data output buffer 24 and specifically show a case wherein the input signal IN1 is "1" (high).

First, a case wherein the specified number is five or more is explained with reference to FIG. 7. In an example of the present embodiment, since the semiconductor device 1 includes the four semiconductor chips 3-0 to 3-3, the control circuit 25 sets the control signal MC to "0" (low level) to suppress the driving power of the data output buffer 24 to a low level. Then, the MOS transistor 41 is turned on since the input signal IN1 is set at "1". Further, since the control signal MC is set at "0", an output signal of the NAND gate 34 becomes "1" and the MOS transistor 42 is turned off. That is, the driving power of the output driver 40 is determined only by the MOS transistor 41.

Next, a case wherein the specified number is four or less is explained with reference to FIG. 8. In an example of the present embodiment, since the semiconductor device 1 includes the four semiconductor chips 3-0 to 3-3, the control circuit 25 sets the control signal MC to "1" to enhance the driving power of the data output buffer 24. Then, the MOS transistor 41 is turned on since the input signal IN1 is set at "1". Further, since the control signal MC is set at "1", an output signal of the NAND gate 34 becomes "0"and the MOS transistor 42 is also turned on. That is, the driving power of the output driver 40 is determined by the MOS transistors 41, 42 and the driving power of the output driver 40 is made higher in comparison with that of a case of FIG. 7.

The above case applies to a case wherein the input signal IN2 is set at "0". Since an output signal of the NOR gate 35 becomes "0" when the control signal MC is set at "0", the driving power of the output driver 40 is determined only by the MOS transistor 43. On the other hand, since an output signal of the NOR gate 35 becomes "1" when the control signal MC is set at "1", the driving power of the output driver 40 is determined by the MOS transistors 43, 44.

As described above, the following effect (1) can be attained in the flash memory according to the first embodiment of this invention.

(1) In a semiconductor device having a plurality of semiconductor chips, data can be transmitted at high speed with the power consumption suppressed to a low level.

With the semiconductor device according to the present embodiment, the voltage driving power of a data output buffer is controlled according to the number of semiconductor chips in a semiconductor device (which may be referred to as a multi-chip package) having a plurality of semiconductor chips. Therefore, an increase in the power consumption can be suppressed to minimum and data can be transmitted at high speed. The effect is explained below.

Figure 9:
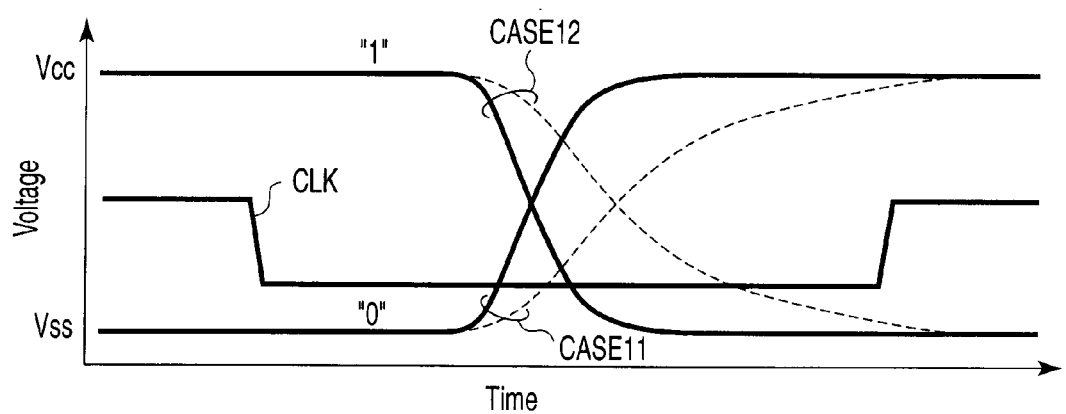
FIG. 9 is a timing chart showing output signals of the semiconductor device.

FIG. 9 shows output signal waveforms of the data output buffer whose driving power is always kept constant. In FIG. 9, CASE11 indicates a case wherein the output signal is changed from "0" to "1" and CASE12 indicates a case wherein the output signal is changed from "1" to "0". Further, the solid lines and broken lines respectively indicate a case wherein the number of semiconductor chips mounted on the semiconductor device is small and a case wherein the number thereof is large. As shown in FIG. 9, an output signal output from the data output buffer is changed from "0" to "1"or from "1" to "0" with a time delay of preset time with respect to a clock CLK which controls outputting of data. The timing at which data is changed is kept unchanged irrespective of the number of semiconductor chips, but the rise speed and fall speed of the signal are dependent on the number of semiconductor chips. That is, when the number of semiconductor chips is large, it takes a longer time to change the data in comparison with the case wherein the number of semiconductor chips is small. This is caused by the load capacitance associated with the data bus to which data is output. For example, if the input/output pin capacitance of one semiconductor chip is 10 pF and when four semiconductor chips are mounted on a semiconductor device, the load capacitance associated with the data bus becomes 40 pF only in the semiconductor device. As a result, the driving power of the data output buffer becomes deficient and it takes a long time to transfer data.

Of course, it is considered to enhance (optimize) the driving power of the data output buffer so that data can be transferred at high speed when the load capacitance of the data bus is large. However, in this case, the driving power becomes excessively high when the number of semiconductor chips contained in the semiconductor device is small although high-speed data transfer can be attained when the number thereof is large. As a result, overshoot or ringing occurs in the output signal waveform, the memory operation becomes unstable to cause an erroneous operation and the power consumption becomes high.

However, the semiconductor device 1 of the present embodiment includes the register 26 which holds the number of the semiconductor chips 3-0 to 3-3 mounted on the semiconductor device 1. The control circuit 25 controls the driving power of the data output buffer 24 based on information held in the register 26. That is, it controls and sets the driving power of the data output buffer 24 to a high level when the number of semiconductor chips mounted on the semiconductor device 1 is large and to a low level when the number is small. For example, with the configuration of FIG. 5, when the number of semiconductor chips is small, the control signal MC becomes "0" and the data bus is driven by the MOS transistors 41, 43. On the other hand, when the number of semiconductor chips is large, the control signal MC becomes "1". As a result, not only the MOS transistors 41, 43 but also the MOS transistors 42, 44 are used to drive the data bus and thus the voltage driving power of the output buffer can be enhanced.

Figure 10:
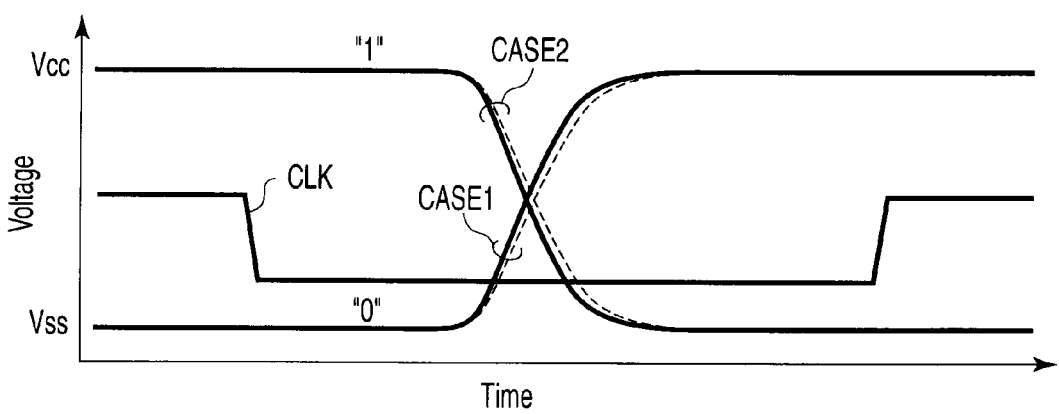
FIG. 10 is a timing chart showing output signals of the semiconductor device according to the first embodiment of this invention.

FIG. 10 shows output signal waveforms of the data output buffer 24. In FIG. 10, CASE1 indicates a case wherein the output signal is changed from "0" to "1" and CASE2 indicates a case wherein the output signal is changed from "1" to "0". Further, the solid lines and broken lines respectively indicate a case wherein the number of semiconductor chips mounted on the semiconductor device is small and a case wherein the number thereof is large. In the present embodiment, as shown in FIG. 10, the rise speed and fall speed of the output signal can be substantially kept constant irrespective of the number of semiconductor chips since the control circuit 25 adequately controls the driving power of the data output buffer 24 according to information in the register 26. Further, the driving power of the data output buffer 24 can be enhanced only when required. Therefore, in the multi-chip package, the low power consumption and high-speed data transfer can be attained.

Figure 11:
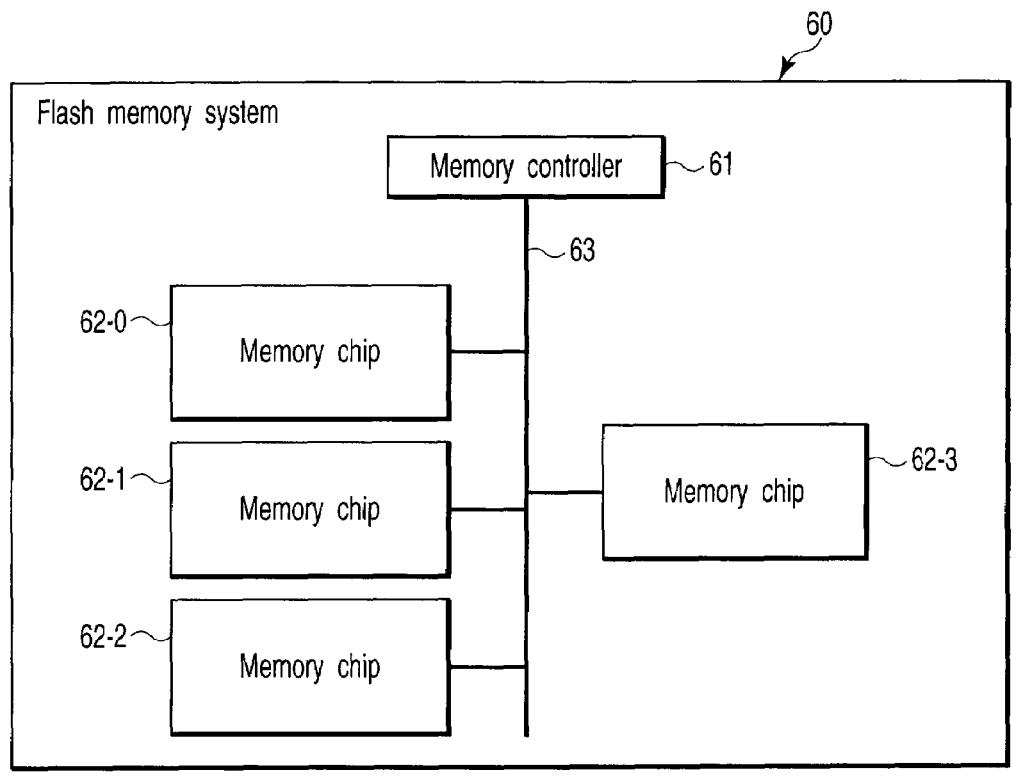
FIG. 11 is a block diagram showing a flash memory system according to a second embodiment of this invention.

Next, a semiconductor device and memory circuit system according to a second embodiment of this invention are explained. The present embodiment relates to a method for controlling the driving power of a data output buffer in the memory circuit system having a plurality of semiconductor devices. FIG. 11 is a block diagram showing a flash memory system according to the present embodiment.

Figure 12:
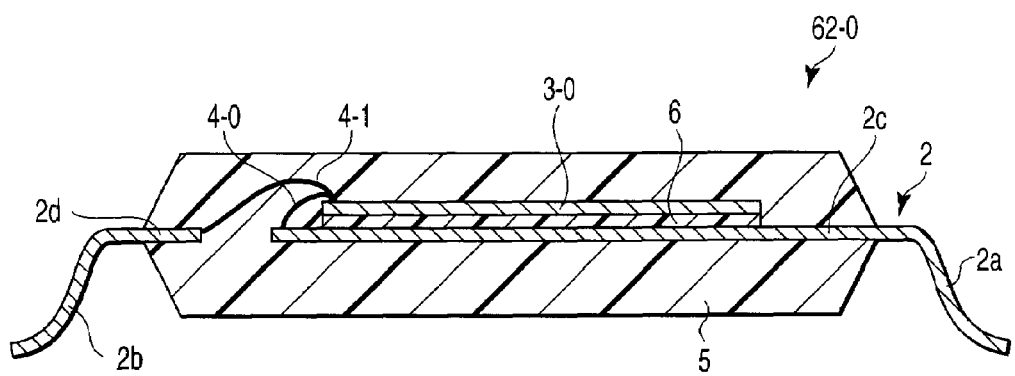
FIG. 12 is a cross-sectional view of a semiconductor device according to the second embodiment of this invention.

As shown in FIG. 11, a flash memory system 60 includes a memory controller 61, four memory chips 62-0 to 62-3 and data bus 63. The memory controller 61 detects the number of memory chips 62-0 to 62-3 contained in the system 60. Each of the memory chips 62-0 to 62-3 is the semiconductor device (semiconductor package device) having the NAND flash memory explained in the first embodiment. Each of the memory chips 62-0 to 62-3 is connected to the memory controller 61 via the data bus 63. The cross-sectional structure of the memory chip 62-0 is explained with reference to FIG. 12. FIG. 12 is a cross-sectional view of the memory chip 62-0 according to the present embodiment. As shown in FIG. 12, the memory chip 62-0 has the structure obtained by omitting the semiconductor chips 3-1 to 3-3 in the structure of FIG. 1 explained in the first embodiment. That is, it can be said that the memory chip 62-0 is the semiconductor device 1 having one semiconductor chip packaged therein. The structures of the memory chips 62-1 to 62-3 have the same structure as described above and the explanation thereof is omitted.

Figure 13:
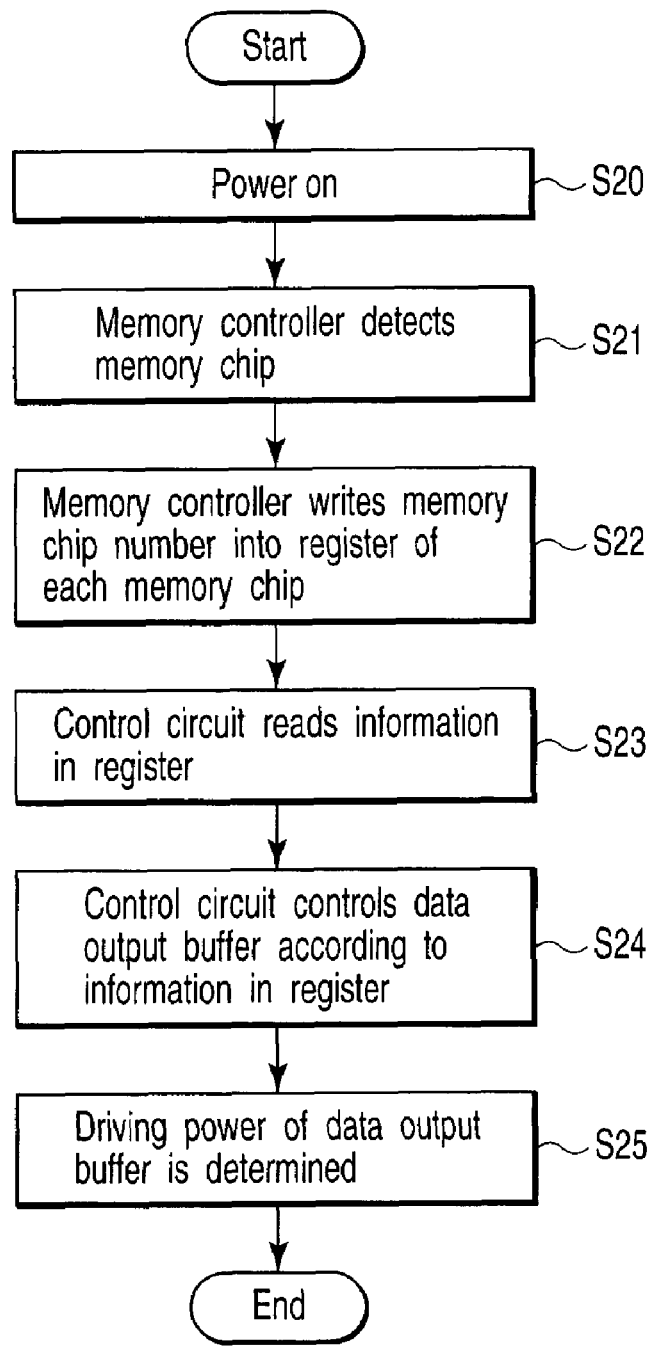
FIG. 13 is a flowchart for illustrating a process of the semiconductor device at the time of supply of power according to the second embodiment of this invention.

The operation of the system 60 with the above configuration performed immediately after supply of power is explained with much attention paid to the control circuit 25 and data output buffer 24 on the semiconductor chip 3-0 contained in each of the memory chips 62-0 to 62-3. FIG. 13 is a flowchart for illustrating the operation of the system 60 performed immediately after supply of power.

First, the power supply switch of the system 60 is turned on (step S20). Then, the memory controller 61 detects the number of memory chips 62-0 to 62-3 contained in the system 60 (step S21). In the case of the present embodiment, the number of memory chips is "four". The memory controller 61 which has detected the number of memory chips writes the detected memory chip number information into the register 26 of each of the memory chips 62-0 to 62-3 (step S22). After this, in each of the memory chips 62-0 to 62-3, the control circuit 25 reads memory chip number information held in the register 26 (step S23). Then, the control circuit 25 generates a control signal MC according to the read information to control the voltage driving power of the data output buffer 24 (step S24). As a result, the voltage driving power of the data output buffer 24 is determined (step S25). The process of step S24 is performed according to the result of determination that the number of memory chips contained in the system 60 is large or small. For example, a specified number is previously held in the register 26 and the number of memory chips actually contained in the system 60 is compared with the specified number. Then, if the number of memory chips is larger than the specified number, the voltage driving power of the data output buffer 24 is made higher, and if it is smaller than the specified number, the voltage driving power is made lower. The concrete operation of the data output buffer 24 can be attained by using the number of memory chips instead of the number of semiconductor chips in FIGS. 7 and 8 explained in the first embodiment.

As described above, the following effect (2) can be attained in the flash memory according to the first embodiment of this invention.

(2) In a memory system having a plurality of semiconductor devices, data can be transmitted at high speed with the power consumption suppressed to a low level.

With the system according to the present embodiment, the voltage driving power of a data output buffer is controlled according to the number of memory chips in a system having a plurality of memory chips (semiconductor package devices). Therefore, an increase in the power consumption can be suppressed to minimum and data can be transmitted at high speed. The effect is explained below.

When the driving power of the data output buffer is always kept constant, the rise speed and fall speed of the signal output from the memory chip are dependent on the number of memory chips contained in the system. As in the first embodiment, this is caused by the load capacitance associated with the data bus to which data is output. For example, if the input/output pin capacitance of one memory chip is 10 pF and when four memory chips are mounted on the system, the load capacitance associated with the data bus becomes 40 pF only for the memory chips. As a result, the driving power of the data output buffer becomes deficient and it takes a long time to transfer data. The signal waveforms obtained at this time become the same as those shown in FIG. 9 explained in the first embodiment, and the signal waveforms are indicated by solid lines when the number of memory chips is small and indicated by broken lines when the number of memory chips is large. That is, when the number of memory chips connected to the same data bus in the system is large, it takes a longer time to change the data in comparison with a case wherein the number of memory chips is small. If the driving power of the data output buffer is previously made high, the driving power becomes excessively high when the number of memory chips in the system is small.

However, the system 60 according to the present embodiment includes the memory controller 61 and the memory chips 62-0 to 62-3 connected to the same data bus 63 each have the register 26. The memory controller 63 measures the number of memory chips 62-0 to 62-3 connected to the data bus 63 and the register 26 holds the result of measurement. Further, the control circuit 25 controls the driving power of the data output buffer 24 based on information held in the register 26. That is, it enhances the driving power of the data output buffer 24 when the number of memory chips connected to the data bus 63 is large and lowers the driving power when the number of chips is small. For example, with the configuration shown in FIG. 5, when the number of memory chips is small, the control signal MC becomes "0" and the data bus is driven by the MOS transistors 41, 43. On the other hand, when the number of memory chips is large, the control signal MC becomes "1". As a result, not only the MOS transistors 41, 43 but also the MOS transistors 42, 44 are used to drive the data bus and the voltage driving power of the output buffer can be enhanced. The output waveforms obtained at this time are the same as those explained with reference to FIG. 10. As a result, in the memory system having a plurality of memory chips, the low power consumption and high-speed data transfer can be attained irrespective of the number of memory chips connected to the same data bus.

Figure 14:
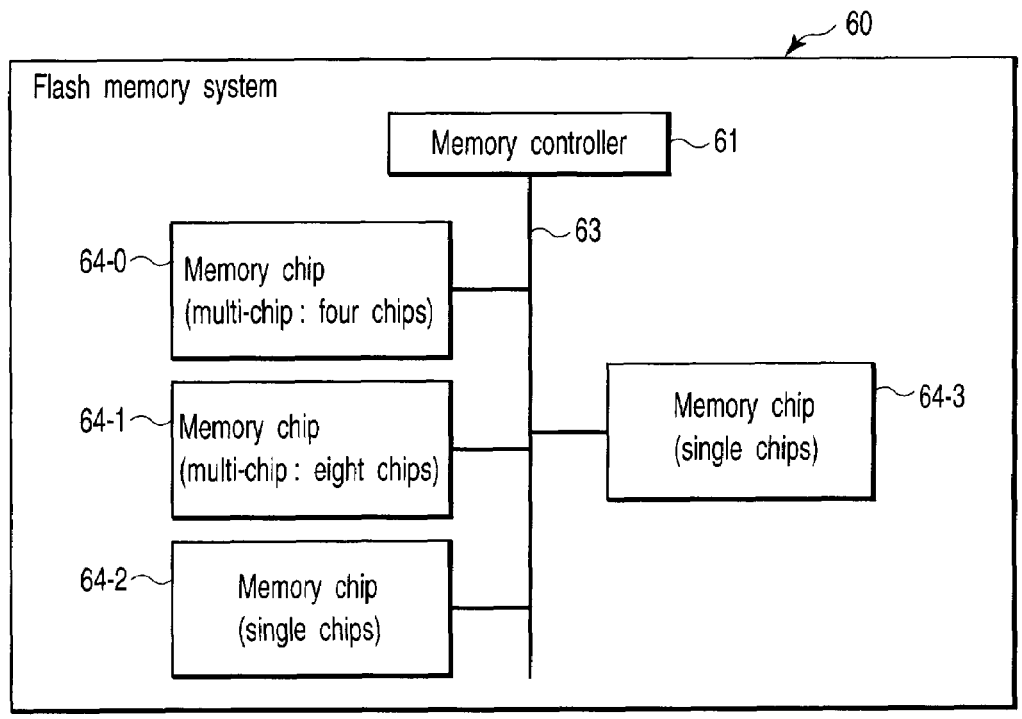
FIG. 14 is a block diagram of a flash memory system according to a third embodiment of this invention.

Next, a semiconductor device and memory circuit system according to a third embodiment of this invention are explained. The present embodiment relates to a case wherein at least one of the memory chips in the second embodiment is a multi-chip package. FIG. 14 is a block diagram of a flash memory system according to the present embodiment.

As shown in FIG. 14, a flash memory system 60 includes a memory controller 61, four memory chips 64-0 to 64-3 and data bus 63. As is explained in the second embodiment, the memory controller 61 detects the number of memory chips 64-0 to 64-3 connected to the same data bus 63. Each of the memory chips 64-0 to 64-3 is the semiconductor device (semiconductor package device) having the NAND flash memory explained in the second embodiment. The memory chips 64-0, 64-1 are multi-chip packages respectively having four and eight semiconductor chips and have the structure explained in the first embodiment. Each of the memory chips 64-2, 64-3 has one semiconductor chip and the structure thereof is the same as that explained in the second embodiment. Each of the memory chips 64-0 to 64-3 is connected to the memory controller 61 via the data bus 63.

In the memory chips 64-0 to 64-3 with the above configuration, the registers 26 on the semiconductor chips respectively provided therein can hold the numbers of semiconductor chips contained in the respective memory chips and the number of memory chips connected to the same data bus 63 in the system 60.

The operation of the system 60 with the above configuration performed immediately after supply of power is explained with reference to FIG. 13 with much attention paid to the control circuit 25 and data output buffer 24 on the semiconductor chip contained in each of the memory chips 64-0 to 64-3.

Figure 15:
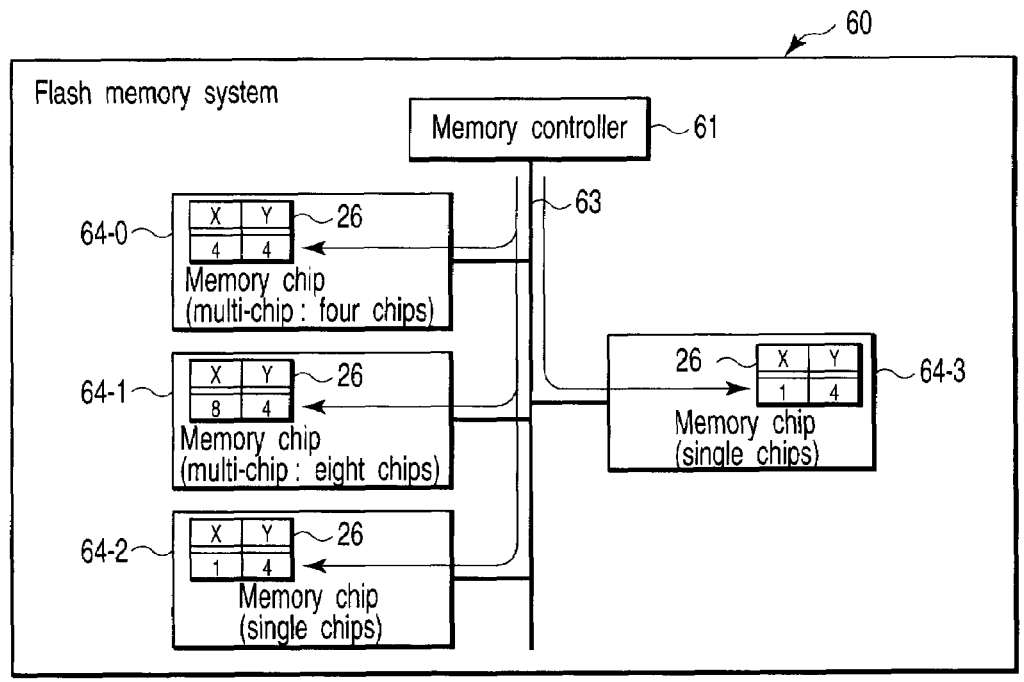
FIG. 15 is a block diagram of a flash memory system according to the third embodiment of this invention, for illustrating the state set immediately after supply of power.

First, the power supply switch of the system 60 is turned on (step S20). Then, the memory controller 61 detects the number of memory chips 64-0 to 64-3 contained in the system 60 (step S21). In the case of the present embodiment, the number of memory chips is "four". The memory controller 61 which has detected the number of memory chips writes the detected memory chip number information into the registers 26 of the respective memory chips 64-0 to 64-3 (step S22). This state is shown in FIG. 15. FIG. 15 is a block diagram of the system 60. In FIG. 15, "X" in each of the registers 26 indicates the number of semiconductor chips mounted on the corresponding memory chip and "Y" indicates the number of memory chips contained in the system 60. As shown in FIG. 15, in the respective registers 26 on the semiconductor chips mounted on the memory chips 64-0 to 64-3, semiconductor chip numbers X=4, 8, 1, 1 are previously written. In this state, the memory controller 61 writes the memory chip number Y=4 into the respective registers 26 on the semiconductor chips mounted on the memory chips 64-0 to 64-3. For example, in the memory chip 64-0, data of X=4 and Y=4 is written into the registers 26 respectively provided on the four semiconductor chips mounted on the memory chip 64-0.

After this, in each of the memory chips 64-0 to 64-3, the control circuit 25 reads semiconductor chip number information X and memory chip number information Y held in the registers 26 (step S23). Then, the control circuit 25 generates a control signal MC according to the read information to control the voltage driving power of the data output buffer 24 (step S24). As a result, the voltage driving power of the data output buffer 24 is determined (step S25). For example, the process of step S24 may be determined according to whether one of the number of memory chips and the number of semiconductor chips exceeds a specified number or whether a combination of both of the numbers exceeds a specified number and the method is not limited. The control signal MC is set to "1" when it is determined as the result of step S23 that the control circuit 25 should enhance the driving power of the data output buffer and the control signal MC is set to "0" in other cases.

As described above, a combination of the effects (1) and (2) explained in the first and second embodiments can be attained according to the third embodiment of this invention. That is, the control circuit 25 on each of the semiconductor chips determines the driving power of the data output buffer based not only on the total number of semiconductor chips in the memory chip on which the corresponding semiconductor chip is mounted but also the number of memory chips connected to the same data bus 63. Therefore, when data is output from any one of the semiconductor chips onto the data bus 63, the driving power of the data output buffer is made optimum and the low power consumption and high-speed data transfer can be attained.

As in the present embodiment, in the second embodiment, the registers 26 may hold the numbers of semiconductor chips mounted on the memory chips 62-0 to 62-3. In this case, X=1 is set in all of the registers 26.

As explained above, with the semiconductor device and memory circuit system according to the first to third embodiments, the driving power of the data output buffer is controlled according to the number of semiconductor chips contained in the multi-chip package. Further, the driving power of the data output buffer is also controlled according to the number of semiconductor devices (semiconductor package devices) connected to the same data bus. Therefore, the driving power of the data output buffer can be set to an optimum value and the low power consumption and high-speed data transfer can be attained.

Figure 16:
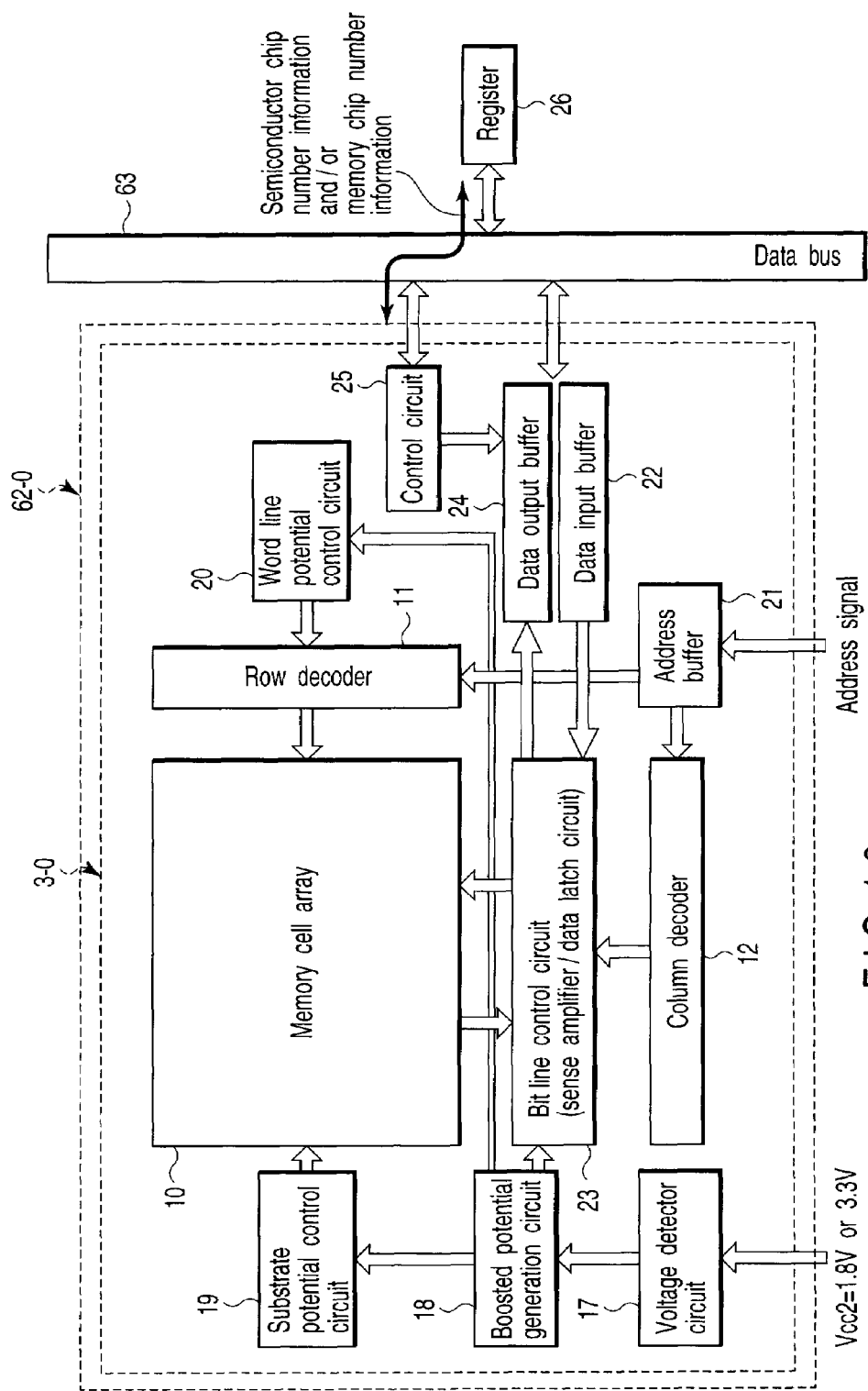
FIG. 16 is a block diagram of a flash memory system according to a first modification of the first to third embodiments of this invention.

In the first to third embodiments, a case wherein the register 26 is contained in the memory chip (or semiconductor device 1) is explained. However, the register 26 may be provided outside the memory chip. FIG. 16 is a block diagram of a memory system according to a first modification of the first to third embodiments. As shown in FIG. 16, the register 26 is provided outside the memory chip 62-0 and they are connected to each other via a data bus. Information indicating the number of semiconductor chips and the number of memory chips is directly written into the register 26 from the exterior of the semiconductor chip 3-0. Then, the control circuit 25 makes access to the register 26 to acquire the information of the number of semiconductor chips and the number of memory chips. The above configuration can be used, but it is desirable to provide the register 26 in the semiconductor chip 3-0 from the viewpoint that the configurations of the semiconductor chip 3-0 and register 26 are simplified.

The data output buffer 24 may have the configuration shown in FIG. 17 or 18. FIGS. 17 and 18 are circuit diagrams of data output buffers 24 according to second and third modifications of the first to third embodiments. First, as shown in FIG. 17, the MOS transistors 42, 44 in the configuration of FIG. 5 explained in the first embodiment may be omitted. Then, the output node of the NAND gate 34 is connected to the gate of the MOS transistor 41 and the output node of the NOR gate 35 is connected to the gate of the MOS transistor 43. With this configuration, if the control signal MC is set to "1", the gate of the MOS transistor 41 is driven by the inverter 31 and NAND gate 34 when the input signal IN1 is "1" and the gate of the MOS transistor 43 is driven by the inverter 32 and NOR gate 35 when the input signal IN2 is "0". As a result, the driving power of the output driver 40 is enhanced.

Further, as shown in FIG. 18, delay circuits 36, 37 can be additionally provided in the configuration of FIG. 5. The delay circuit 36 delays an output of the NAND gate 34 and then inputs the output to the gate of the MOS transistor 42. The delay circuit 37 delays an output of the NOR gate 35 and then inputs the output to the gate of the MOS transistor 44. With this configuration, the rise time and fall time of the output signal can be shortened by shifting timings at which the MOS transistors 42, 44 are turned on by use of the delay circuits 36, 37.

The above embodiment is explained by taking a case wherein the data output buffer 24 has two steps of driving power (MC="0" and "1") as an example. However, the number of steps of the driving power may be set to three or more. For example, the number of p-channel MOS transistors and n-channel MOS transistors is increased and the control signal MC is set to a signal of two or more bits. Then, the configuration in which a certain MOS transistor is driven by a bit in the control signal and another MOS transistor is driven by another bit can be formed. Of course, the configuration of the data output buffer 24 is not limited to the configuration shown in FIGS. 5, 17 and 18. The configuration in which the driving power can be controlled by the control circuit 25 can be used.

Figure 19:
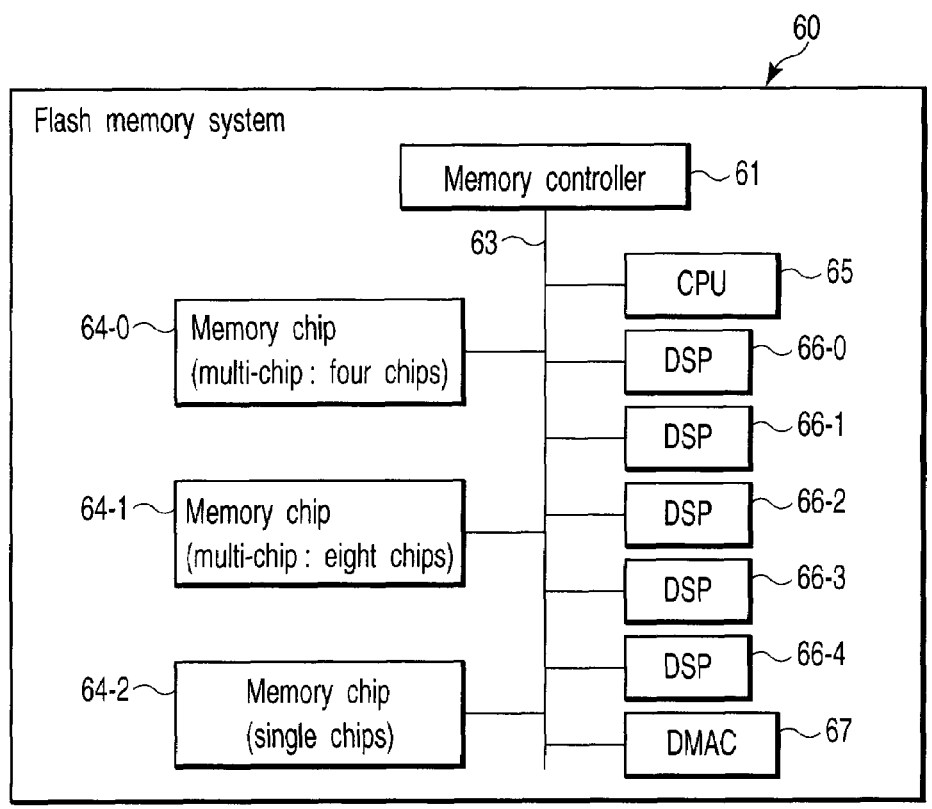
FIG. 19 is a block diagram of a flash memory system according to a fourth embodiment of the first to third embodiments of this invention.

The configuration is explained by taking the system having the memory controller 61 and memory chips as an example in the second and third embodiments, but the configuration is not limited to this case. For example, the configuration of FIG. 19 can be used. FIG. 19 is a block diagram of a flash memory system according to a fourth modification of the first to third embodiments. As shown in FIG. 19, the system 60 is obtained by using a CPU 65, digital signal processors (DSPs) 66-0 to 66-4 and direct memory access (DMA) controller 67 instead of the memory chip 64-3 in the configuration of FIG. 14 explained in the third embodiment. Thus, in the system having the configuration other than the memory controller and memory chips, the first to third embodiments can be applied. Further, the CPU 65 or DMA controller 67 may perform the function of the memory controller 61. Further, in the case of the configuration of FIG. 19, the memory controller 61 can detect not only the number of memory chips 64-0 to 64-2 but also the number of entire semiconductor devices such as the CPU 65 connected to the data bus 63 and write the detected numbers into the registers 26. The control circuit 25 controls the data output buffer 24 based on the numeric values. This is because the load capacitance associated with the data bus 63 is caused not only by the memory chips but also by the CPU, DSP and DMA controller. Further, the memory controller 61 may detect not only the number of semiconductor devices connected to the data bus 63 but also the memory capacity of the memory chips. This is because the load capacitance of the data bus 63 is changed according to the memory capacity.

In the first to third embodiments, the semiconductor device which can be operated on a plurality of power supply voltages is explained as an example. However, embodiments can be applied to a semiconductor device which is operated on single power supply voltage. In this case, when the power supply voltage is low, the above embodiments have particularly significant effects.

Next, a concrete example of the second and third embodiments is explained.

[Memory Card]

Figure 20:
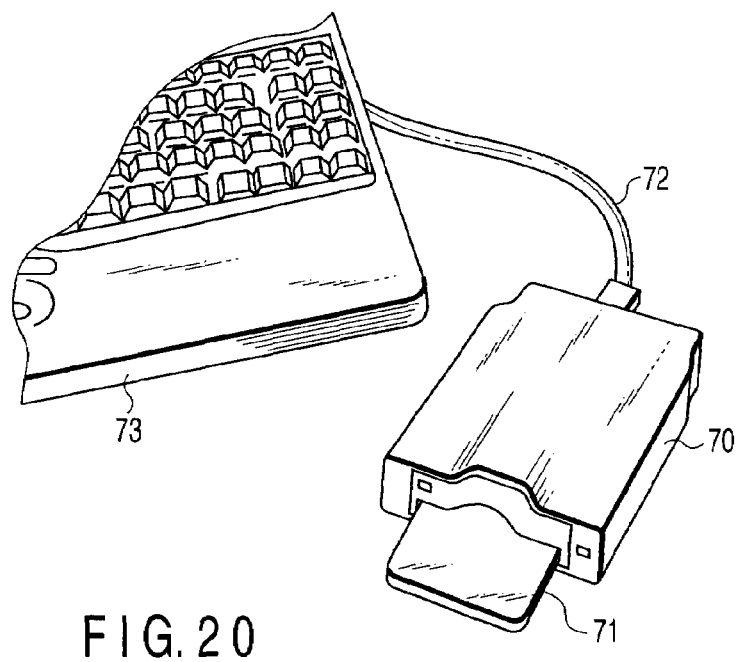
FIG. 20 is an external view of a memory card containing the semiconductor memory according to the first to third embodiments of this invention.

The memory system 60 may be a memory card, for example. FIG. 20 is an external view of a personal computer, memory card and memory card reader/writer. As shown in FIG. 20, a memory card 71 is inserted into a reader/writer 70. The reader/writer 70 is connected to a personal computer 73 via a connection cable 72. The memory card 71 has the flash memory system 60 explained in the above embodiments provided in the internal portion thereof. The personal computer 73 reads data from and writes data into the memory card 71 via the reader/writer 70.

[USB Memory]

The memory system 60 may be a USB memory, for example. The USB memory has the flash memory system 60 explained in the above embodiments provided in the internal portion thereof and is connected to the personal computer via a USB terminal.

[Portable Music Player]

The memory system 60 may be a portable music player, for example. The portable music player has the flash memory system 60 explained in the above embodiments provided in the internal portion thereof and holds music data. The portable music player is connected to the personal computer via a connection cable or the like. The personal computer writes encoded music data into the portable music player.

[IC Card]

Figure 21:
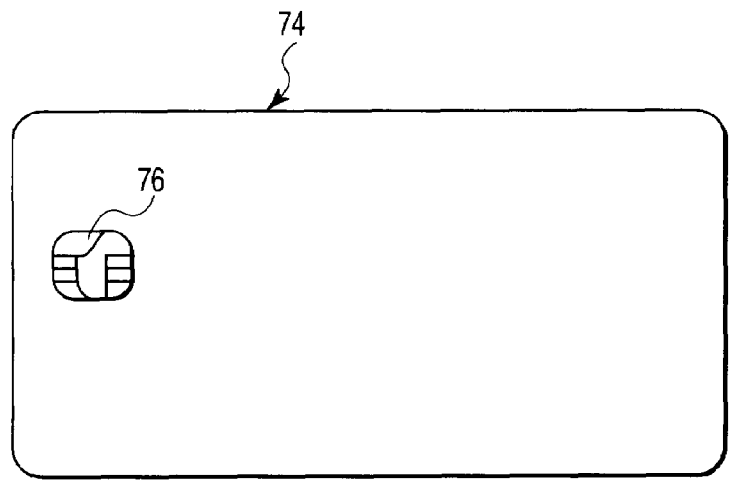
FIG. 21 is an external view of a memory card containing the semiconductor memory according to the first to third embodiments of this invention.
Figure 22:
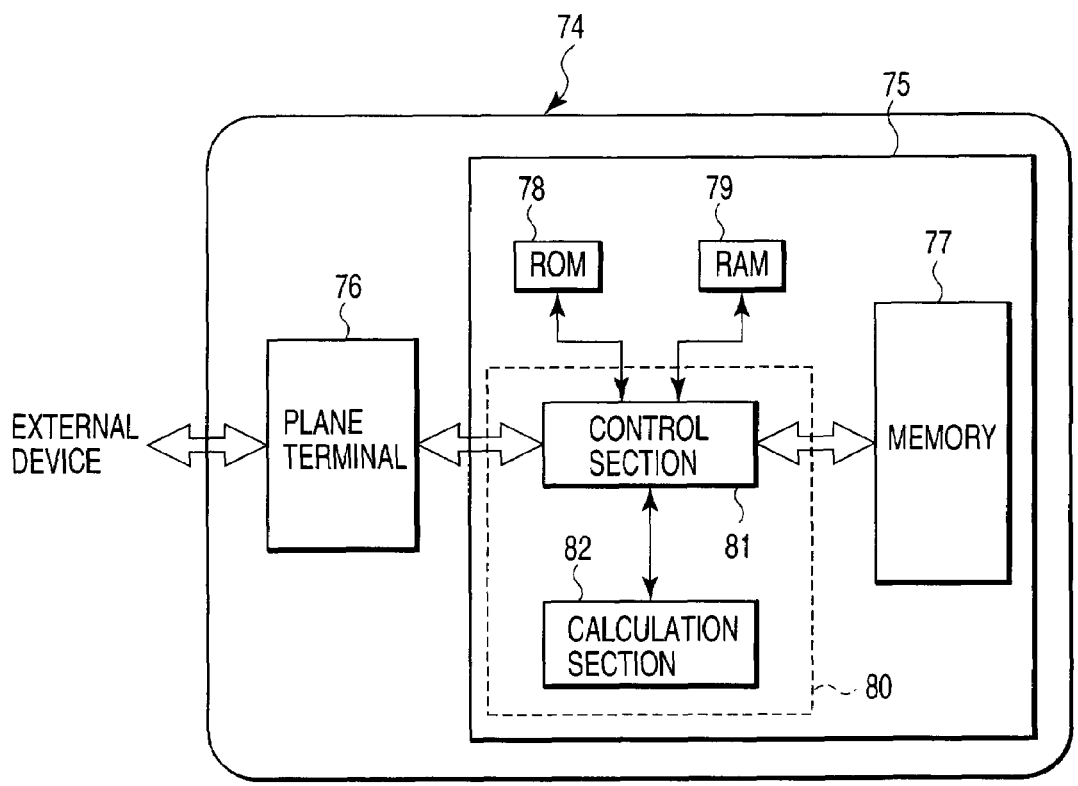
FIG. 22 is a block diagram of a memory card containing the semiconductor memory according to the first to third embodiments of this invention.

The memory system 60 may be an IC card, for example. FIGS. 21 and 22 are an external view and internal block diagram of the IC card. As shown in FIGS. 21 and 22, an IC card 74 includes an MCU 75 and plane terminal 76. The MCU 75 corresponds to the system 60 explained in the second and third embodiments. The MCU 75 includes a flash memory 77 and other circuits such as ROM 78, RAM 79 and CPU 80. The above circuits are connected via a data bus. The CPU 80 includes a control section 81 and calculation section 82, for example. The connection between the respective circuit blocks is controlled by the controller 81 and, for example, the signal processing is performed by the calculation section 82.

The first to third embodiments can be applied to the above application, for example.

Figure 23:
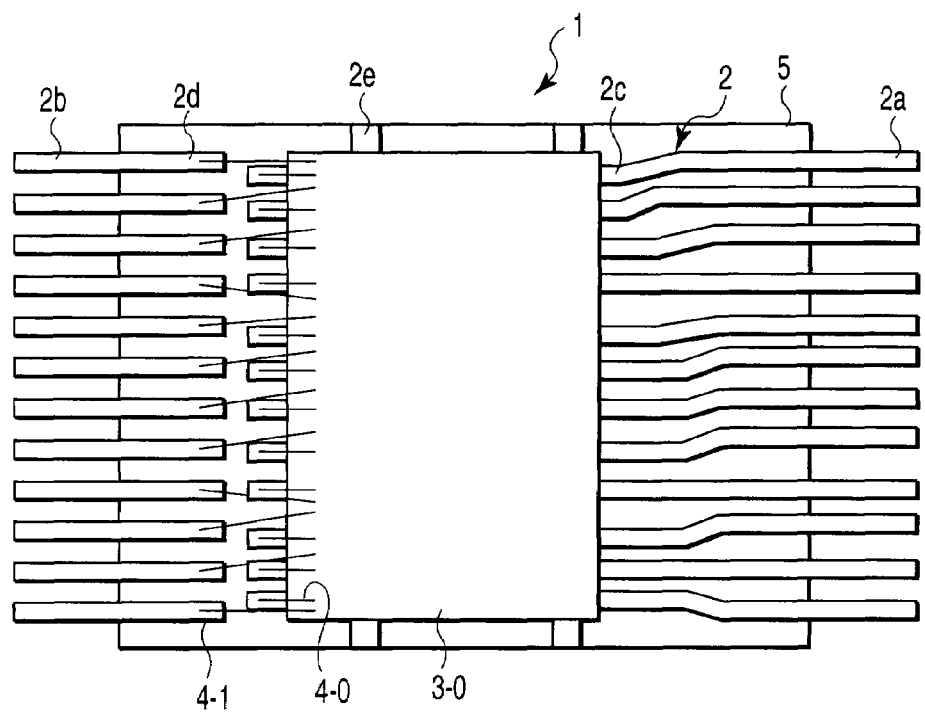
FIG. 23 is a top view of the semiconductor memory according to the first to third embodiments of this invention when viewing through the internal portion thereof.
Figure 24:
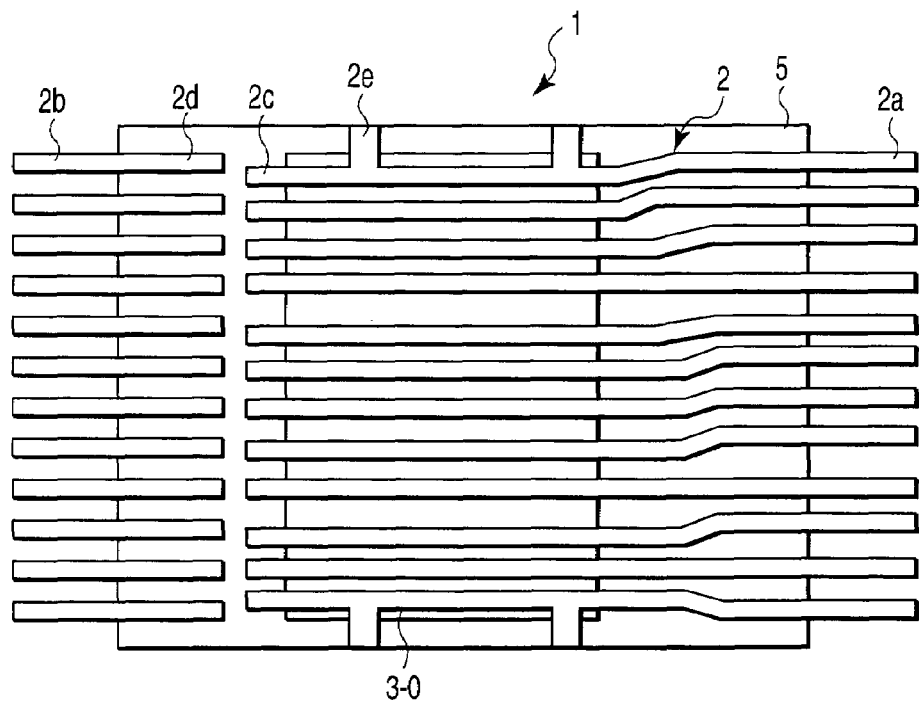
FIG. 24 is a bottom view of the semiconductor memory according to the first to third embodiments of this invention when viewing through the internal portion thereof.
Figure 25:
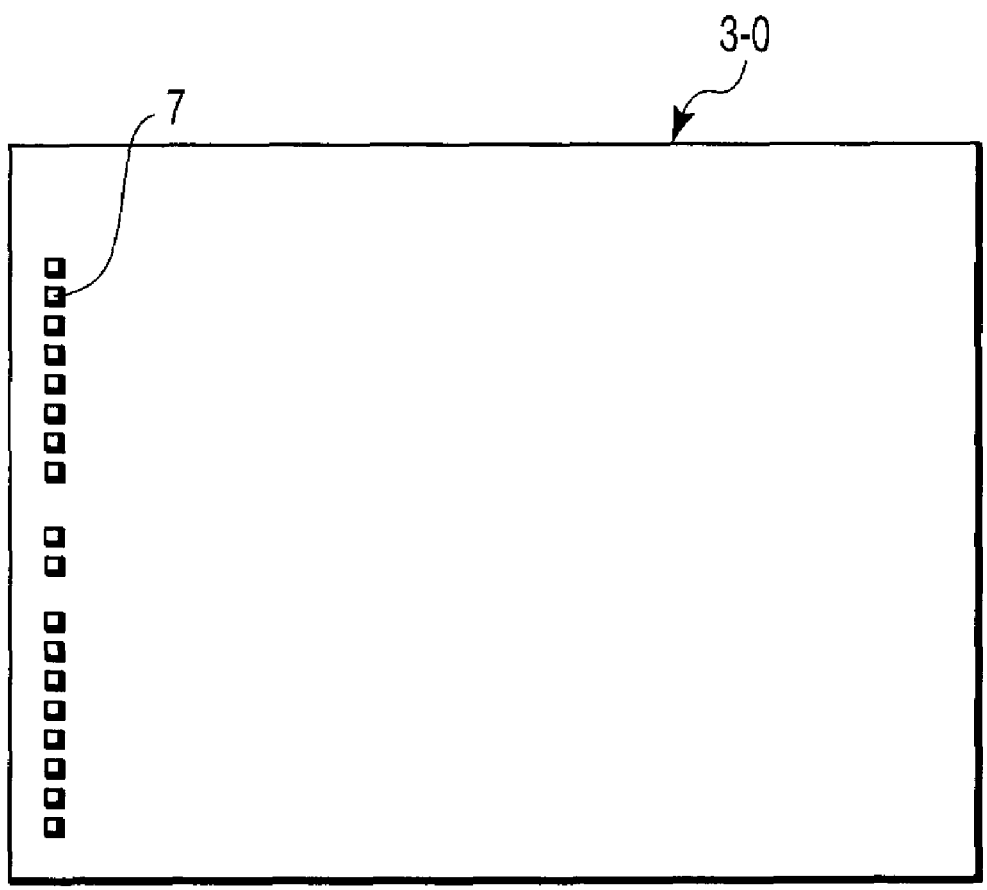
FIG. 25 is a top view of the semiconductor memory according to the first to third embodiments of this invention.

Next, the lead frame 2 used in the semiconductor device explained in the above embodiment is explained with reference to FIGS. 23 to 25 by taking the configuration of the first embodiment as an example. FIG. 23 is a plan (top) view of the internal portion of the semiconductor device 1 when viewing through the internal portion thereof from the front surface side, FIG. 24 is a plan (bottom) view of the internal portion of the semiconductor device 1 when viewing through the internal portion thereof from the rear surface side, and FIG. 25 is an external (top) view of the semiconductor chip mounted on the semiconductor device 1. In FIGS. 23 to 25, only the semiconductor chip 3-0 is shown.

As shown in the drawings, the lead frame 2 includes a suspension pin portion 2e in addition to external leads 2a, 2b and internal leads 2c, 2d. The suspension pin portion 2e is connected to a portion of the internal lead 2c which is a longer one of the internal leads and lies on the outermost side. As shown in FIG. 25, bonding pads 7 are concentratedly arranged along one side of the chip on the element forming surface of the semiconductor chip 3-0. The semiconductor chip 3-0 is mounted on the suspension pin portion 2e and die lead portions of the longer internal leads 2c with a spacer 6 interposed therebetween. As the spacer 6, for example, an organic-series insulating film and normal mount agent are used. The semiconductor chip 3-0 is so arranged that the bonding pads 7 will be set close to the other internal leads 2d, that is, the shorter internal leads on which the semiconductor chip 3-0 is not mounted. In other words, the end portions of the internal leads 2d are arranged to face the bonding pads 7, the internal leads 2c pass through on the rear surface side of the semiconductor chip 3-0 and are extended so that the end portions thereof will lie in positions between the semiconductor chip 3-0 and the internal leads 2d. The spacer 6 is used to enhance the degree of insulation between the rear surface of the semiconductor chip 3-0 and the die lead portions and a film-like insulating adhesive agent attached to the rear surface of a wafer in the scribe (dicing) step to discretely separate the wafer into semiconductor chips 3-0 can be used as the spacer.

The internal leads 2d on which the semiconductor chip 3-0 is not mounted are connected to bonding pads which are part of the bonding pads 7 via bonding wires 4-1. Further, the end portions of the longer internal leads 2c on which the semiconductor chip 3-0 is mounted are respectively connected to bonding pads which are part of the bonding pads 7 via bonding wires 4-0. The resin 5 seals the internal leads 2c, 2d and suspension pin portion 2e of the lead frame 2, semiconductor chip 3-0 and bonding wires 4-0, 4-1 to form a resin package.

With the above structure, since the semiconductor chip 3-0 has a chip layout in which the bonding pads 7 are concentratedly arranged on one side of the chip on the element forming surface side (which is called a one-side pad), the chip size can be made small. That is, in the memory chip with large capacity such as a NAND flash memory, for example, the circuit connection can be rationally made according to the layout of the peripheral circuits and the area is changed accordingly. In this respect, in the case of the one-side pad structure, since the layout of the wires between the pads and the peripheral circuits can be rationally made, the chip area becomes smaller accordingly. Of course, the above embodiment can be applied to the structure other than the one-side pad structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory circuit system comprising:
a plurality of semiconductor devices each of which have a first semiconductor chip in a package, the first semiconductor chip of at least one of the semiconductor device including a memory cell array having memory cells which store data, an output buffer which outputs data read from the memory cell array to an exterior, and a control circuit which controls driving power of the output buffer;
a data bus which connects the semiconductor devices;
a system control device which detects the number of semiconductor devices connected to the data bus, and
a memory device which stores information on the number of semiconductor devices detected by the system control device and is provided outside the semiconductor devices, the control circuit controlling the driving power according to the number of semiconductor devices stored in the memory device.

2. The system according to claim 1, wherein at least one of the semiconductor devices further includes second semiconductor chip which has the memory cell array, output buffer and control circuit, the memory device stores information on the number of first and second semiconductor chips and the control circuit of the semiconductor device controls the driving power according to the numbers of the first and second semiconductor chips and the number of the semiconductor devices stored in the memory device.

3. The system according to claim 2, further comprising a conductive body on which the first and second semiconductor chips are mounted, wherein the first semiconductor chip is adhered to the conductive body with a semiconductor element forming surface thereof up and the second semiconductor chip is adhered to the first semiconductor chip with a semiconductor element forming surface thereof up.

4. The system according to claim 1, wherein the output buffer includes a plurality of MOS transistors which output a voltage to an output node of the output buffer, and the control circuit controls the number of the MOS transistors to be turned on.

5. The system according to claim 4, wherein the control circuit shifts timings at which the MOS transistors are turned on for the respective MOS transistors when the plurality of MOS transistors are turned on.

6. The system according to claim 1, wherein the output buffer includes a MOS transistor which outputs a voltage to an output node of the output buffer, and the control circuit controls a gate voltage of the MOS transistor.

7. A semiconductor device comprising:
a plurality of semiconductor chips provided in a package, each of the semiconductor chips including a memory cell array having memory cells, an output buffer, a control circuit, and a memory device,
wherein the memory device is capable of storing information on the number of semiconductor chips connected to a data bus and the control circuit controls a driving power of the output buffer according to the number of semiconductor chips stored in the memory device.

8. The device according to claim 7, further comprising a conductive body on which the semiconductor chips are mounted, wherein the plurality of semiconductor chips include a first semiconductor chip and a second semiconductor chip, the first semiconductor chip is adhered to the conductive body with a semiconductor element forming surface thereof up and the second semiconductor chip is adhered to the first semiconductor chip with a semiconductor element forming surface thereof down.

9. A memory circuit system comprising:
a plurality of semiconductor devices each of which have a first semiconductor chip in a package, the first semiconductor chip of at least one of the semiconductor device including a memory cell array having memory cells which store data, an output buffer which outputs data read from the memory cell array to an exterior, and a control circuit which controls driving power of the output buffer;
a data bus which connects the semiconductor devices;
a system control device which detects the number of semiconductor devices connected to the data bus, and
a memory device which is provided in each of the semiconductor devices and stores information on the number of semiconductor devices detected by the system control device, the control circuit controlling the driving power according to the number of semiconductor devices stored in the memory device.

10. The system according to claim 9, wherein the control circuit in each of the semiconductor devices controls the driving power according to the number of semiconductor chips stored in the memory device of each of the respective semiconductor devices.

11. The system according to claim 10, wherein the memory device is provided in the first semiconductor chip.

12. The system according to claim 11, wherein at least one of the semiconductor devices further includes second semiconductor chip which has the memory cell array, output buffer and control circuit, the memory device of the semiconductor device having the second semiconductor chips stores information on the number of second semiconductor chip contained in the semiconductor device, and the control circuit of the semiconductor device having the second semiconductor chip controls the driving power according to the numbers of the first and second semiconductor chips and the number of the semiconductor devices stored in the memory device.

13. The system according to claim 12, wherein the memory device stores a sum of the number of the first and second semiconductor chips.

14. The system according to claim 12, wherein the memory device is provided in the first and second semiconductor chips.

15. The system according to claim 12, further comprising a conductive body on which the first and second semiconductor chips are mounted, wherein the first semiconductor chip is adhered to the conductive body with a semiconductor element forming surface thereof up and the second semiconductor chip is adhered to the first semiconductor chip with a semiconductor element forming surface thereof up.

16. The system according to claim 12, wherein the output buffer includes a plurality of MOS transistors which output a voltage to an output node of the output buffer, and the control circuit controls the number of the MOS transistors to be turned on.

17. The system according to claim 16, wherein the control circuit shifts timings at which the MOS transistors are turned on for the respective MOS transistors when the plurality of MOS transistors are turned on.

18. The system according to claim 10, wherein the output buffer includes a MOS transistor which outputs a voltage to an output node of the output buffer, and the control circuit controls a gate voltage of the MOS transistor.

* * * * *